(12) United States Patent
Cheng et al.

(10) Patent No.: US 12,439,719 B2
(45) Date of Patent: Oct. 7, 2025

(54) CMOS IMAGE SENSOR

(71) Applicant: Hua Hong Semiconductor (Wuxi) Limited, Wuxi (CN)

(72) Inventors: Liusuo Cheng, Wuxi (CN); Guanglong Chen, Wuxi (CN); Han Wang, Wuxi (CN); Jiliang Zhang, Wuxi (CN); Jiangyong Qian, Wuxi (CN)

(73) Assignee: Hua Hong Semiconductor (Wuxi) Limited, Wuxi (CN)

( * ) Notice: Subject to any disclaimer, the term of this patent is extended or adjusted under 35 U.S.C. 154(b) by 743 days.

(21) Appl. No.: 17/696,700

(22) Filed: Mar. 16, 2022

(65) Prior Publication Data
US 2022/0320171 A1 Oct. 6, 2022

(30) Foreign Application Priority Data
Mar. 31, 2021 (CN) .......................... 202110344989.8

(51) Int. Cl.
*H10F 39/00* (2025.01)
*H10F 39/18* (2025.01)

(52) U.S. Cl.
CPC ......... *H10F 39/8063* (2025.01); *H10F 39/18* (2025.01); *H10F 39/8037* (2025.01); *H10F 39/807* (2025.01); *H10F 39/811* (2025.01)

(58) Field of Classification Search
CPC ......... H01L 27/14627; H01L 27/14612; H01L 27/1463; H01L 27/14636; H01L 27/14643; H01L 27/14629; H01L 27/14625; H01L 27/1464; H01L 27/14634; H01L 27/14623; H01L 27/14645; H01L 27/1461; H01L 27/1469; H01L 21/762; H01L 21/76224; H01L 21/76229; H01L 21/76; H01L 27/14689; H01L 27/14692; H01L 27/14641; H01L 27/14638; H10F 39/8037; H10F 39/8063; H10F 39/807;
(Continued)

(56) References Cited

U.S. PATENT DOCUMENTS 5,796,154 A * 8/1998 Sano ..................... H10F 77/413
257/443
6,255,640 B1 * 7/2001 Endo ....................... G02B 5/20
438/70
(Continued)

FOREIGN PATENT DOCUMENTS

WO   WO-2020045121 A1 *   3/2020   ....... H01L 27/14612

*Primary Examiner* — Raj R Gupta
(74) *Attorney, Agent, or Firm* — Harris Beach Murtha Cullina PLLC

(57) ABSTRACT

A CMOS image sensor, a first dielectric layer is formed on a first surface of a semiconductor substrate, and a plurality of lower microlenses having a bottom surface in the shape of an arc concave structure and located directly above the corresponding photodiode are formed in the first dielectric layer. A plurality of upper microlenses having a top surface in the shape of an arc convex structure and located directly above the corresponding lower microlens are formed on the top surface of the first dielectric layer. The refractive index of the material of the upper microlens is greater than or equal to the refractive index of the material of the lower microlens, and the refractive index of the material of the lower microlens is greater than the refractive index of the first dielectric layer.

12 Claims, 4 Drawing Sheets

(58) Field of Classification Search
CPC .... H10F 39/811; H10F 39/18; H10F 39/8067; H10F 39/806; H10F 39/199; H10F 39/809; H10F 39/8057; H10F 39/182; H10F 39/8033; H10F 39/80; H10F 39/802; H10F 39/8023; H10F 39/8027; H10F 39/803; H10F 39/80373; H10F 39/80377; H10F 39/804; H10F 39/805; H10F 39/8053; H10F 39/812; H10F 39/813

See application file for complete search history.

(56) References Cited

U.S. PATENT DOCUMENTS

| | | | |
|---|---|---|---|
| 10,079,256 B2* | 9/2018 | Lenchenkov | H01L 27/14621 |
| 11,438,533 B2* | 9/2022 | Yonemoto | H04N 25/709 |
| 2012/0200728 A1* | 8/2012 | Kobayashi | H10F 39/8063 |
| | | | 257/E31.127 |
| 2015/0346547 A1* | 12/2015 | Wakabayashi | G02F 1/133526 |
| | | | 349/95 |
| 2016/0233259 A1* | 8/2016 | Sekine | H01L 27/14685 |

* cited by examiner

CMOS IMAGE SENSOR

CROSS-REFERENCE TO RELATED APPLICATION

This application claims priority to Chinese patent application No. CN 202110344989.8, filed on Mar. 31, 2021, and entitled "CMOS IMAGE SENSOR", the disclosure of which is incorporated herein by reference in its entirety.

TECHNICAL FIELD

The present application relates to a semiconductor integrated circuit, and in particular to a CMOS image sensor.

BACKGROUND

The existing CMOS image sensor (CIS) is composed of a pixel unit circuit and a CMOS circuit. Compared with the CCD image sensor, the CMOS image sensor has a better integratability due to the CMOS standard production process, and thus can be integrated with other digital-analog operation and control circuits on the same chip, so as to better adapt to the future development.

According to the number of transistors provided in the pixel unit circuit of the existing CMOS image sensor, the existing CMOS image sensor is mainly classified into a 3T structure and a 4T structure.

FIG. 1 is a schematic diagram of an equivalent circuit of a pixel unit circuit of an existing 3T CMOS image sensor. The pixel unit circuit of the existing 3T CMOS image sensor includes a photosensitive diode, i.e., a photo diode (PD) D1, and a CMOS pixel readout circuit. The CMOS pixel readout circuit is a 3T pixel circuit, including a reset transistor M1, an amplifier transistor M2, and a selection transistor M3, all of which are NMOS selection transistors.

An N-type region of the photosensitive diode D1 is connected to the source of the reset transistor M1.

The gate of the reset transistor M1 is connected to a reset signal Reset, and the reset signal Reset is a potential pulse. When the reset signal Reset is at a high level, the reset transistor M1 is turned on, and electrons of the photosensitive diode D1 are absorbed into a power supply Vdd of the readout circuit to realize the reset. When irradiated, the photosensitive diode D1 generates photo-generated electrons, the potential thereof rises, and an electrical signal is transmitted via an amplification circuit. The gate of the selection transistor M3 is connected to a row selection signal Rs, to select an amplified electrical signal for output, i.e., an output signal Vout.

FIG. 2 is a schematic diagram of an equivalent circuit of a pixel unit circuit of an existing 4T CMOS image sensor. The structure shown in FIG. 2 differs from the structure shown in FIG. 1 by adding a transfer transistor, which is referred to as a transfer transistor M4. The source region of the transfer transistor 4 is an N-type region connected to the photosensitive diode D1. The drain region of the transfer transistor 4 is a floating diffusion (FD) region, and the gate of the transfer transistor 4 is connected to a transmission control signal Tx. After generated by the photosensitive diode D1, the photo-generated electrons are transferred to the floating diffusion region via the transfer transistor 4, and then signal amplification is achieved by connecting the floating diffusion region to the gate of the amplification transistor M2.

According to the light incident mode, the CMOS image sensors are classified into frontside illumination (FSI) CMOS image sensors and backside illumination (BSI) CMOS image sensors. In FSI CIS, incident light needs to pass through a metal interconnection structure to enter the photodiode. Since metal reflects light, it is necessary to provide an incident channel on the top of the photodiode, wherein no metal wire and no via are provided in the incident channel. Generally, the size of the incident channel is relatively small, and the angle at which the incident light reaches the photodiode is relatively small. In order to increase light incident into the photodiode, a microlens is usually provided to collect light. The microlens can collect light from a larger range, such as light surrounding the metal wire or directly above the via, into the photodiode, so as to improve the sensitivity.

The incident light in BSI CIS is incident from the backside of a semiconductor substrate, and a metal interconnection structure is provided on the frontside of the semiconductor substrate. Therefore, the metal interconnection structure does not affect the incident light, and the light utilization of BSI CIS thus is extremely high.

In recent years, with the advancement of the integrated circuit manufacturing technology and the development of 5G and artificial intelligence, the CMOS image sensor plays an increasingly important role. As an important branch of the image sensor, the process of the frontside illumination CMOS image sensor is also being developed. The existing frontside illumination CMOS image sensors all use microlenses to collect light, so as to improve the sensitivity.

FIG. 3 is a schematic diagram of a device structure of an existing FSI CMOS image sensor. FIG. 4 is an analysis diagram of an incident angle of incident light of a photodiode in FIG. 3. In the existing FSI CMOS image sensor, a photodiode 103 is formed on the semiconductor substrate (not shown). The pixel region of the CMOS image sensor includes a plurality of pixel units, and each of the pixel units includes a photodiode 103.

The incident light is incident onto the photodiode 103 from the frontside of the semiconductor substrate. A first dielectric layer 101 is formed on the frontside of the semiconductor substrate.

The pixel unit also includes a CMOS pixel readout circuit, and is used to read photo-generated electrons of the photodiode 103.

A metal interconnection structure 104 is formed on a first surface of the semiconductor substrate. The metal interconnection structure 104 includes multiple layers of metal wires, and the adjacent metal wires are connected to each other by a via and isolated from each other by an interlayer film.

The metal wire and the via are not provided directly above each of the photodiodes 103, so as to form an incident channel.

A plurality of microlenses 102 are formed on the top surface of the first dielectric layer 101, and the top surface of the microlens 102 has an arc convex structure. The refractive index of the microlens 102 is greater than or equal to the refractive index of the first dielectric layer 101.

Incident light 105 is collected by the microlens 102 and then is incident onto the photodiode 103 after passing through the incident channel.

Referring to FIG. 4, taking light a as an example, at point o, since the refractive index of the microlens 102 is greater than the refractive index of air, an refractive angle of the light a entering the microlens 102 is less than an incident angle, in which case the light deviates toward the right.

If the refractive index of the microlens 102 is equal to the refractive index of the first dielectric layer 101, the light is not deflected after passing through the point o, and finally is incident onto the photodiode 103 along the direction of light b. If the refractive index of the microlens 102 is greater than the refractive index of the first dielectric layer 101, the light is deflected toward the right after entering the first dielectric layer 101. If the incident angle of light incident onto the photodiode can be increased, the sensitivity of the device necessarily can be improved and the optical absorption efficiency necessarily can be increased.

BRIEF SUMMARY

A technical problem to be solved by the present application is to provide a CMOS image sensor, so as to increase an incident angle of light incident onto a photodiode, thereby improving the sensitivity of the device and increasing the optical absorption efficiency.

In order to solve the above technical problem, a pixel region of the CMOS image sensor provided by the present application includes a plurality of pixel units, each of the pixel units includes a photodiode, and each of the photodiodes is formed on a semiconductor substrate.

Incident light is incident onto the photodiode from a first surface of the semiconductor substrate.

A first dielectric layer is formed on the first surface of the semiconductor substrate, and the first dielectric layer has a first refractive index.

A plurality of lower microlenses are formed in the first dielectric layer, the bottom surface of the lower microlens has an arc concave structure, the material of the lower microlens has a second refractive index, and each of the lower microlenses is located directly above the corresponding photodiode.

A plurality of upper microlenses are formed on the top surface of the first dielectric layer, the top surface of the upper microlens has an arc convex structure, the material of the upper microlens has a third refractive index, and each of the upper microlenses is located directly above the corresponding lower microlens.

The third refractive index is greater than or equal to the second refractive index, and the second refractive index is greater than the first refractive index.

The upper microlens and the lower microlens form a composite microlens on a path of the incident light, and the composite microlens increases an incident angle of the incident light incident onto the photodiode.

In an improvement, the CMOS image sensor is a frontside illumination CMOS image sensor, and the first surface of the semiconductor substrate is a frontside.

In an improvement, the semiconductor substrate includes a silicon substrate.

In an improvement, the pixel unit further includes a CMOS pixel readout circuit, and the CMOS pixel readout circuit is used to read photo-generated electrons of the photodiode.

In an improvement, the CMOS image sensors include 3T CMOS image sensors and 4T CMOS image sensors.

In the 3T CMOS image sensor, the CMOS pixel readout circuit includes a reset transistor, an amplification transistor, and a selection transistor.

In the 4T CMOS image sensor, the CMOS pixel readout circuit includes a reset transistor, an amplification transistor, a selection transistor, a transfer transistor, and a floating diffusion region.

In an improvement, the reset transistor, the amplification transistor, the selection transistor, the transfer transistor are all NMOS transistors.

In an improvement, a metal interconnection structure is formed on the first surface of the semiconductor substrate, the metal interconnection structure includes multiple layers of metal wires, and the adjacent metal wires are connected to each other by a via and isolated from each other by an interlayer film.

In an improvement, the metal wire and the via are not provided directly above each of the photodiode, so as to form an incident channel.

In an improvement, an N-type region of each of the photodiodes is composed of an N-type ion implantation region or an N-type epitaxial layer formed on the semiconductor substrate, and a P-type region of each of the photodiodes is composed of the P-type doped semiconductor substrate at the bottom of the N-type region.

In an improvement, an isolation structure is provided between the photodiodes, and the isolation structure is used to achieve optical or electrical isolation between the photodiodes.

In an improvement, the isolation structure includes deep trench isolation.

In an improvement, the top surface of the lower microlens is flush with the top surface of the first dielectric layer, the bottom surface of the upper microlens is flush with the top surface of the first dielectric layer, and the top surface of the lower microlens is in contact with the bottom surface of the upper microlens.

In an improvement, the top surface of the lower microlens and the bottom surface of the upper microlens are equal in size and completely aligned.

In an improvement, in a top view, the composite microlens has a size greater than the size of the incident channel and completely covers the incident channel, and in the top view, the photodiode has a size greater than the size of the incident channel and completely covers the incident channel.

In an improvement, center lines of the composite microlens, the incident channel, and the photodiode are aligned.

Unlike the prior art in which a convex microlens is directly formed on the top surface of the first dielectric layer, in the present application, the lower microlens having a bottom surface in the shape of an arc concave structure is formed in the first dielectric layer, and the upper microlens having a top surface in the shape of an arc convex structure is formed on the surface of the dielectric layer, wherein the third refractive index of the upper microlens is set to be greater than or equal to the second refractive index of the lower microlens and the second refractive index is greater than the first refractive index of the first dielectric layer. The composite microlens formed after the above setting can increase the incident angle of the incident light incident onto the photodiode, thereby improving the sensitivity of the device and increasing the optical absorption efficiency.

BRIEF DESCRIPTION OF THE DRAWINGS

The present application is described below in detail with reference to the drawings and specific embodiments.

DETAILED DESCRIPTION OF THE DISCLOSURE

Figure 5:
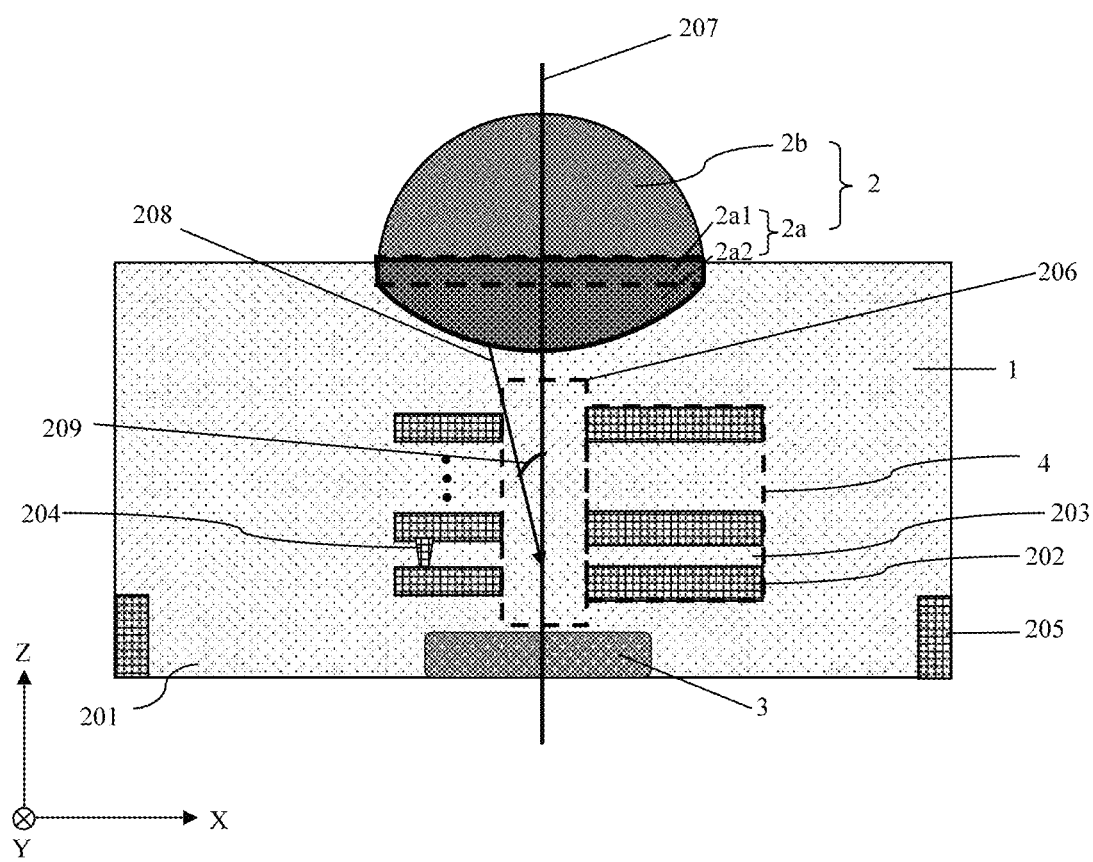
FIG. 5 is a schematic diagram of a device structure of a CMOS image sensor according to an embodiment of the present application.

FIG. 5 is a schematic diagram of a device structure of a CMOS image sensor according to an embodiment of the present application. A pixel region of the CMOS image sensor according to the embodiment of the present application includes a plurality of pixel units, each of the pixel units includes a photodiode 3, and each of the photodiodes 3 is formed on a semiconductor substrate (not shown).

Incident light is incident onto the photodiode 3 from a first surface of the semiconductor substrate.

A first dielectric layer 1 is formed on the first surface of the semiconductor substrate, and the first dielectric layer 1 has a first refractive index.

A plurality of lower microlenses 2a are formed in the first dielectric layer 1, the bottom surface of the lower microlenses 2a has an arc concave structure, the material of the lower microlens 2a has a second refractive index, and each of the lower microlenses 2a is located directly above the corresponding photodiode 3.

A plurality of upper microlenses 2b are formed on the top surface of the first dielectric layer 1, the top surface of the upper microlens 2b has an arc convex structure, the material of the upper microlens 2b has a third refractive index, and each of the upper microlenses 2b is located directly above the corresponding lower microlens 2a.

The third refractive index is greater than or equal to the second refractive index, and the second refractive index is greater than the first refractive index.

The upper microlens 2a and the lower microlens 2b form a composite microlens 2 on a path of the incident light, and the composite microlens 2 increases an incident angle of the incident light incident onto the photodiode 3.

In the embodiment of the present application, the CMOS image sensor is a frontside illumination CMOS image sensor, and the first surface of the semiconductor substrate is a frontside.

The semiconductor substrate includes a silicon substrate.

The pixel unit further includes a CMOS pixel readout circuit, and the CMOS pixel readout circuit is used to read photo-generated electrons of the photodiode 3.

The CMOS image sensors include 3T CMOS image sensors and 4T CMOS image sensors.

In the 3T CMOS image sensor, the CMOS pixel readout circuit includes a reset transistor, an amplification transistor, and a selection transistor.

In the 4T CMOS image sensor, the CMOS pixel readout circuit includes a reset transistor, an amplification transistor, a selection transistor, a transfer transistor, and a floating diffusion region.

The reset transistor, the amplification transistor, the selection transistor, the transfer transistor are all NMOS transistors.

A metal interconnection structure 4 is formed on the first surface of the semiconductor substrate, the metal interconnection structure 4 includes multiple layers of metal wires, and the adjacent metal wires are connected to each other by a via and isolated from each other by an interlayer film.

The metal wire and the via are not provided directly above each of the photodiode 3, so as to form an incident channel.

An N-type region of each of the photodiodes 3 is composed of an N-type ion implantation region or an N-type epitaxial layer formed on the semiconductor substrate, and a P-type region of each of the photodiodes 3 is composed of the P-type doped semiconductor substrate at the bottom of the N-type region.

An isolation structure is provided between the photodiodes 3, and the isolation structure is used to achieve optical or electrical isolation between the photodiodes 3.

The isolation structure includes deep trench isolation.

The top surface of the lower microlens 2a is flush with the top surface of the first dielectric layer 1, the bottom surface of the upper microlens 2b is flush with the top surface of the first dielectric layer 1, and the top surface of the lower microlens 2a is in contact with the bottom surface of the upper microlens 2b.

In some examples, the top surface of the lower microlens 2a and the bottom surface of the upper microlens 2b are equal in size and completely aligned.

In a top view, the composite microlens 2 has a size greater than the size of the incident channel and completely covers the incident channel, and in the top view, the photodiode 3 has a size greater than the size of the incident channel and completely covers the incident channel.

Center lines of the composite microlens 2, the incident channel, and the photodiode 3 are aligned.

Figure 6:
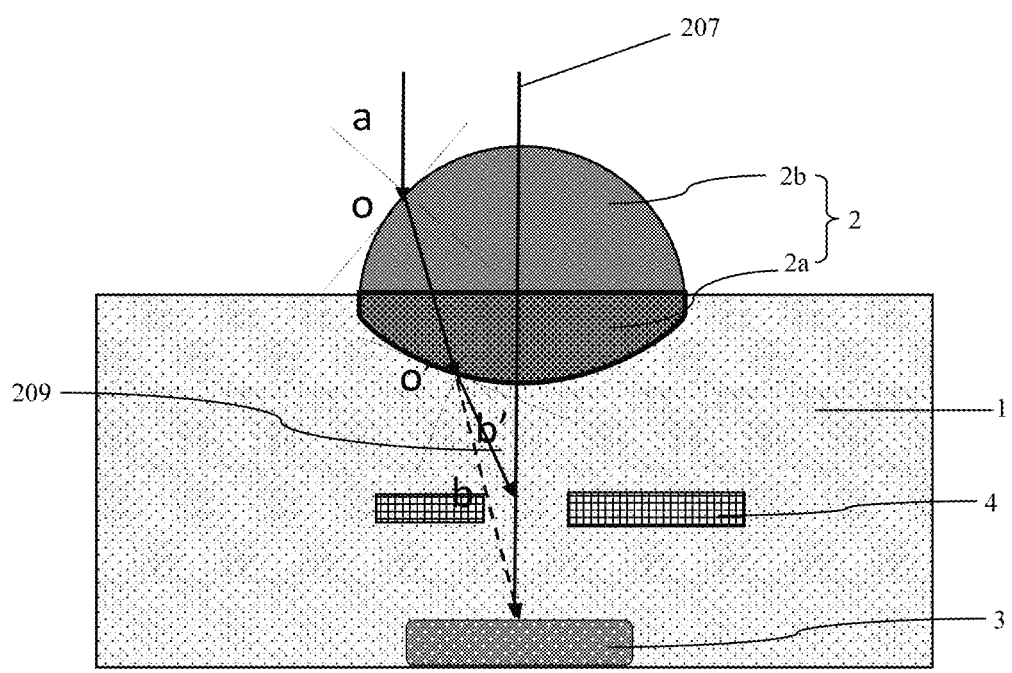
FIG. 6 is an analysis diagram of an incident angle of incident light of a photodiode in FIG. 5.

Referring to FIG. 6, light a is used as an example to explain why the embodiment of the present invention can increase the incident angle of light incident onto the photodiode 3.

At point o, since the third refractive index is greater than the refractive index of air, a refractive angle of the light a entering the upper microlens 2b is less than the incident angle, in which case the light deviates toward the right.

If the second refractive index is equal to the third refractive index, the light is not deflected from point o to point o'; if the second refractive index is less than the third refractive index, the light is deflected toward the right after entering the lower microlens 2a.

Figure 1:
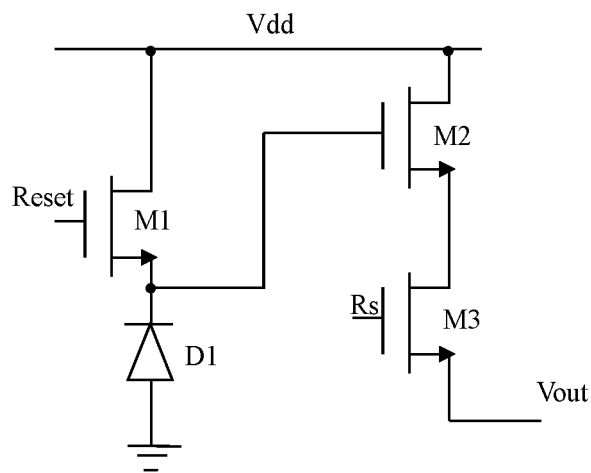
FIG. 1 is a schematic diagram of an equivalent circuit of a pixel unit circuit of an existing 3T CMOS image sensor.
Figure 2:
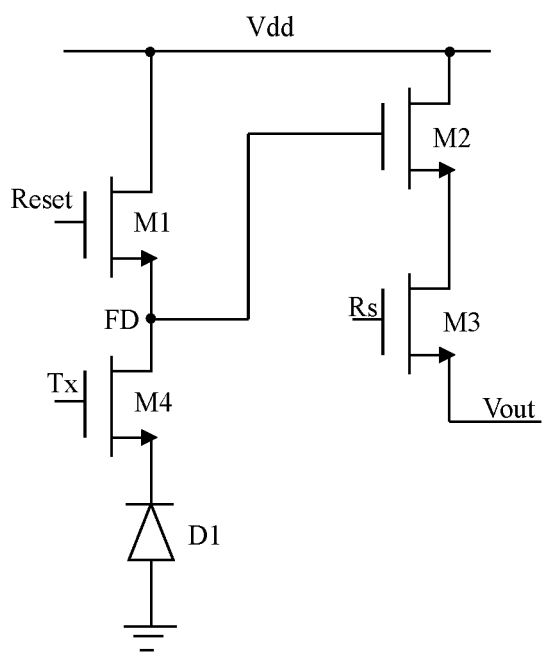
FIG. 2 is a schematic diagram of an equivalent circuit of a pixel unit circuit of an existing 4T CMOS image sensor.
Figure 3:
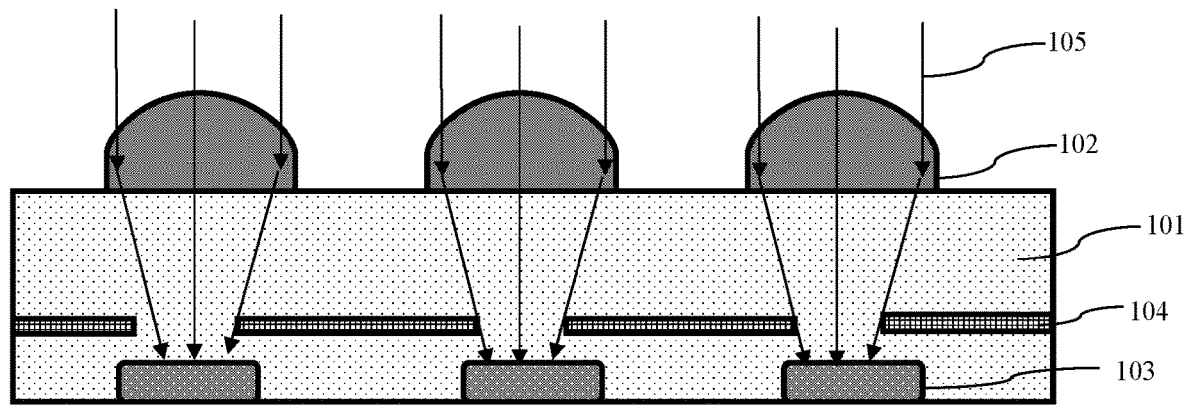
FIG. 3 is a schematic diagram of a device structure of an existing FSI CMOS image sensor.
Figure 4:
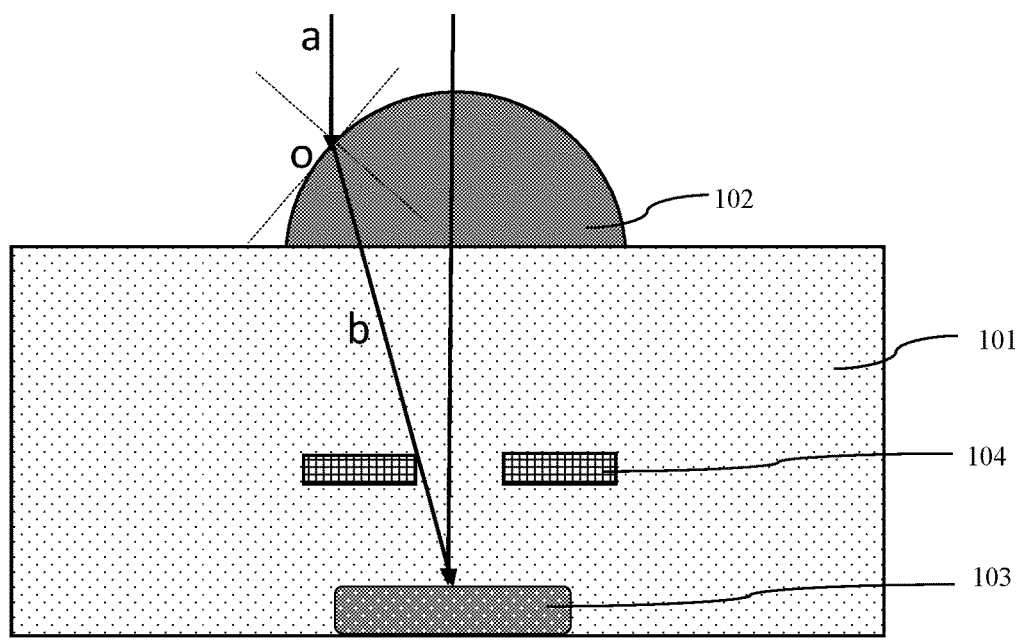
FIG. 4 is an analysis diagram of an incident angle of incident light of a photodiode in FIG. 3.

At point o', since the second refractive index is greater than the first refractive index, the light is deflected toward the right, and finally is incident onto the photodiode 3 along the direction of light b'. Light b corresponding to the dashed line is light incident onto a photodiode 103 of an existing device corresponding to FIG. 4. It can be seen that an incident angle of the light b' incident onto the photodiode 3, i.e., an included angle with respect to the center line, is greater than an incident angle of the light b.

Unlike the prior art in which a convex microlens is formed on the top surface of the first dielectric layer 1, in the present application, the lower microlens 2a having a bottom surface in the shape of an arc concave structure is formed in the first dielectric layer 1, and the upper microlens 2b having a top surface in the shape of an arc convex structure is formed on the surface of the dielectric layer 1, wherein the third refractive index of the upper microlens 2b is set to be greater than or equal to the second refractive index of the lower microlens 2a and the second refractive index is greater than the first refractive index of the first dielectric layer 1. The composite microlens 2 formed after the above setting can increase the incident angle of the incident light incident onto the photodiode 3, thereby improving the sensitivity of the device and increasing the optical absorption efficiency.

The present application is described above in detail via specific embodiments, but these embodiments do not intended to limit the present application. Without departing from the principle of the present application, those skilled in the art can make many modifications and improvements, which shall also be regarded as the protection scope of the present application.

What is claimed is:

1. A CMOS image sensor, wherein:
a pixel region of the CMOS image sensor comprises a plurality of pixel units, each of the pixel units comprises a photodiode, and each of the photodiodes is formed on a semiconductor substrate;
incident light is incident onto the photodiode from a first surface of the semiconductor substrate;
a first dielectric layer is formed on the first surface of the semiconductor substrate, and the first dielectric layer has a first refractive index;
a plurality of lower microlenses are formed in the first dielectric layer, the bottom surface of the lower microlens has an arc concave structure, the material of the lower microlens has a second refractive index, and each of the lower microlenses is located directly above the corresponding photodiode;
a plurality of upper microlenses are formed on the top surface of the first dielectric layer, the top surface of the upper microlens has an arc convex structure, the material of the upper microlens has a third refractive index, and each of the upper microlenses is located directly above the corresponding lower microlens;
the third refractive index is greater than the second refractive index, and the second refractive index is greater than the first refractive index; and
the upper microlens and the lower microlens form a composite microlens on a path of the incident light, and the composite microlens increases an incident angle of the incident light incident onto the photodiode;
the top surface of the lower microlens is flush with the top surface of the first dielectric layer, the bottom surface of the upper microlens is flush with the top surface of the first dielectric layer, and the top surface of the lower microlens is in contact with the bottom surface of the upper microlens;
the top surface of the lower microlens and the bottom surface of the upper microlens are equal in size and completely aligned;
center lines of the composite microlens, the incident channel, and the photodiode are aligned;
the top surface of the upper microlens has a circular arc shape;
the side surface of the top part of the lower microlens is perpendicular to the top surface of the top part of the lower microlens;
the bottom surface of the bottom part of the lower microlens is in the shape of a circular arc;
the radius of the bottom surface of the bottom part of the lower microlens is greater than the radius of the top surface of the upper microlens.

2. The CMOS image sensor according to claim 1, wherein the CMOS image sensor is a frontside illumination CMOS image sensor, and the first surface of the semiconductor substrate is a frontside.

3. The CMOS image sensor according to claim 2, wherein the semiconductor substrate comprises a silicon substrate.

4. The CMOS image sensor according to claim 2, wherein the pixel unit further comprises a CMOS pixel readout circuit, and the CMOS pixel readout circuit is used to read photo-generated electrons of the photodiode.

5. The CMOS image sensor according to claim 4, wherein the CMOS image sensor comprises 3T CMOS image sensors and 4T CMOS image sensors;
in the 3T CMOS image sensor, the CMOS pixel readout circuit comprises a reset transistor, an amplification transistor, and a selection transistor; and
in the 4T CMOS image sensor, the CMOS pixel readout circuit comprises a reset transistor, an amplification transistor, a selection transistor, a transfer transistor, and a floating diffusion region.

6. The CMOS image sensor according to claim 5, wherein the reset transistor, the amplification transistor, the selection transistor, the transfer transistor are all NMOS transistors.

7. The CMOS image sensor according to claim 5, wherein a metal interconnection structure is formed on the first surface of the semiconductor substrate, the metal interconnection structure comprises multiple layers of metal wires, with adjacent metal wires connected to each other by a via and isolated from each other by an interlayer film.

8. The CMOS image sensor according to claim 7, wherein a metal wire of the multiple layers of metal wires and the via are not provided directly above each of the photodiode, so as to form an incident channel.

9. The CMOS image sensor according to claim 2, wherein an N-type region of each of the photodiodes is located on the semiconductor substrate;
and a P-type region of each of the photodiodes is composed of the semiconductor substrate at the bottom of the N-type region; wherein the semiconductor substrate is P-type doped.

10. The CMOS image sensor according to claim 9, wherein an isolation structure is provided between the photodiodes, and the isolation structure is used to achieve optical or electrical isolation between the photodiodes.

11. The CMOS image sensor according to claim 10, wherein the isolation structure comprises deep trench isolation.

12. The CMOS image sensor according to claim 1, wherein on a plane parallel to the top surface of the first dielectric layer, the composite microlens has a size greater than the size of the incident channel and completely covers the incident channel, and the photodiode has a size greater than the size of the incident channel and completely covers the incident channel.

* * * * *